United States Patent [19]

Marsh et al.

[11] Patent Number: 5,566,441
[45] Date of Patent: Oct. 22, 1996

[54] ATTACHING AN ELECTRONIC CIRCUIT TO A SUBSTRATE

[75] Inventors: Michael J. C. Marsh, Johannesburg; Mark H. Carson, Pretoria; Gideon J. Gouws, Pretoria; Mario A. Marais, Pretoria; Trevor M. Hodson, Randburg, all of South Africa

[73] Assignee: British Technology Group Limited, London, England

[21] Appl. No.: 209,046

[22] Filed: Mar. 11, 1994

[30] Foreign Application Priority Data

Mar. 11, 1993 [ZA] South Africa ............................ 93/1752

[51] Int. Cl.⁶ ............................................... H01P 11/00
[52] U.S. Cl. ...................... 29/600; 29/840; 228/180.22; 428/901
[58] Field of Search ............................. 29/600, 846, 847, 29/840; 428/901; 228/180.21, 180.22

[56] References Cited

U.S. PATENT DOCUMENTS

| | | | |
|---|---|---|---|
| 4,506,148 | 3/1985 | Berthold et al. | |
| 4,720,690 | 1/1988 | Popek et al. | 29/600 X |
| 4,783,646 | 11/1988 | Matsuzaki | |
| 4,844,784 | 7/1989 | Suzuki et al. | 428/901 X |
| 4,916,808 | 4/1990 | Sanborn et al. | 29/600 X |
| 4,963,891 | 10/1990 | Aoyagi et al. | 29/600 X |
| 5,055,968 | 10/1991 | Nishi et al. | 29/600 X |
| 5,272,596 | 12/1993 | Honore et al. | 428/901 X |
| 5,346,750 | 9/1994 | Hatakeyama et al. | 428/901 X |
| 5,386,214 | 1/1995 | Sugawara. | |

FOREIGN PATENT DOCUMENTS

| | | |
|---|---|---|
| 61-182302 | 8/1986 | Japan. |
| 5-67911 | 3/1993 | Japan. |
| 5-129826 | 5/1993 | Japan. |
| 92/0039 | 3/1992 | South Africa. |
| 92/01953 | 2/1992 | WIPO. |

Primary Examiner—Carl J. Arbes
Attorney, Agent, or Firm—Lowe, Price, LeBlanc & Becker

[57] ABSTRACT

Integrated circuits such as transponders are attached to a substrate such as cardboard packaging material by adhering an integrated circuit in the substrate, applying a patch antenna to the substrate and the integrated circuit, and applying a sealing layer over the integrated circuit and at least a portion of the antenna. In variations of the method, an indentation may be formed in the substrate into which the integrated circuit is placed. The patch antenna may be screen printed onto the substrate and the integrated circuit, using conductive ink, or may be a metallic foil which is applied to the substrate and the integrated circuit. Where the integrated circuit is a transponder, it can be programmed with an identification code, either before or after being attached to the substrate.

44 Claims, 5 Drawing Sheets

ATTACHING AN ELECTRONIC CIRCUIT TO A SUBSTRATE

BACKGROUND OF THE INVENTION

South African patent application No. 92/0039 describes an identification system in which transponders are attached to articles to be identified, such as containers or packaged articles in a supermarket, with the transponders carrying an identification code which identifies each article, either uniquely or as one of a number of articles of a particular type.

In order for such a system to be economically viable, it is important to provide a relatively simple but effective way of attaching the transponders to the containers or packages.

SUMMARY OF THE INVENTION

According to the invention a method of attaching an electronic circuit to a substrate comprises:

providing an electronic circuit having at least two electrical terminals:

securing the electronic circuit to the substrate; and applying a conductive element to the substrate and the electronic circuit to define an antenna, so that the conductive element makes electrical contact with the at least two electrical terminals.

The conductive element may comprise a layer of conductive ink, printed in the shape of the antenna.

The conductive ink may comprise carbon or metallic particles.

Alternatively, the conductive element may comprise a metallic foil.

The metallic foil may be applied to the electronic circuit prior to securing the integrated circuit to the substrate, with the foil and the circuit being applied together to the substrate.

Alternatively, the metallic foil may be applied to the substrate after the electronic circuit has been secured to the substrate.

The metallic foil may have an adhesive layer thereon for securing the foil to the substrate.

The adhesive layer is preferably removed from the metallic foil in areas corresponding to the position of the electrical terminals of the electronic circuit prior to application of the foil to the electronic circuit or the substrate.

The metallic foil may be applied to the substrate prior to securing the electronic circuit to the substrate, and the electronic circuit may be subsequently attached to predetermined areas of the metallic foil, thereby to secure the electronic circuit to the substrate.

The electrical contacts of the electronic circuit may be attached to predetermined areas of the foil using a conductive adhesive.

The method may include applying solder to the at least two electrical terminals, applying the conductive layer to the substrate so that it makes contact with the terminals, and reflowing the solder to join the antenna to the terminals.

The method may include forming a cavity or indentation in the substrate to receive the electronic circuit.

The cavity or indentation may be formed by punching or stamping the substrate.

Alternatively, the cavity or indentation may be formed by moulding.

In another version of the invention, the cavity or indentation is formed in a plastics substrate by the application of a heated tool.

In a further version of the invention the cavity or indentation is formed in a plastics substrate by heating the electronic circuit and pressing it into the substrate.

Preferably, an upper surface of the electronic circuit bearing the electrical terminals is substantially flush with the surface of the substrate after being secured thereto.

The method may include applying a protective coating over the electronic circuit and at least a portion of the antenna.

The protective coating may comprise a layer of settable sealant.

Alternatively, the protective coating may comprise a label.

The electronic circuit will in most cases be an integrated circuit such as a transponder.

In the case of a transponder which is programmable with an identity code, the method may include programming the identity code into the transponder before or after securing it to the substrate.

The method may include applying contacts of a programming device to both the transponder and the antenna after securing the transponder and the antenna to the substrate, to program the transponder.

The method may include applying at least one contact element to the substrate which is in contact with a respective terminal of the transponder, and applying contacts of a programming device to the antenna and the at least one contact element after securing the transponder and the antenna to the substrate, to program the transponder.

Preferably, the method includes applying a protective coating to the transponder, a portion of the antenna and a portion of the contact element prior to programming of the transponder, the contacts of the programming device being applied to uncoated portions of the antenna and the contact element.

In one embodiment of the invention, the substrate comprises at least first and second components, the second component being secured to the first component after attachment of the electronic circuit and the antenna thereto, so that the electronic circuit and the antenna are substantially enclosed.

The invention extends to a packaging component comprising a substrate to which an integrated circuit has been attached by the above method.

The substrate may comprise cardboard, or may comprise glass, plastics or metal, for example.

The substrate may define a container, or a closure for a container, for example.

The invention further extends to an identification tag comprising a substrate to which an integrated circuit has been attached by the above method.

DESCRIPTION OF EMBODIMENTS

Figures 1, 2:
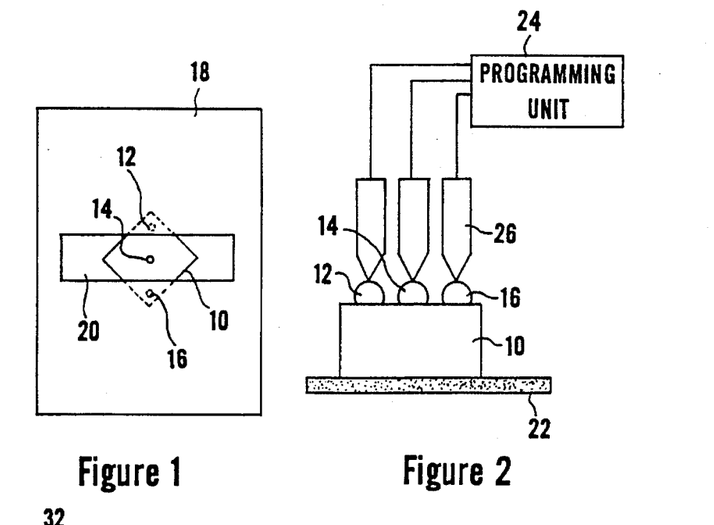
FIG. 1 is a schematic plan view of an integrated circuit transponder with a patch antenna applied thereto.
FIGS. 2 to 6 illustrate schematically a method of programming the transponder and attaching it to a substrate.

FIG. 1 is a schematic plan view of an integrated circuit transponder 10 which is formed with three conductive contacts or terminals 12, 14 and 16 on its upper surface, and which is embedded in the surface of a substrate (see below). Applied to the substrate over the transponder 10 is a rectangular patch antenna 18 which has an elongate central slot 20. The patch antenna 18 is oriented so that areas thereof on either side of the slot 20 are in electrical contact with the terminals 12 and 16 of the transponder, while the central terminal 14 of the transponder is in the slot 20, clear of the patch antenna.

The transponder and the patch antenna are designed to operate at relatively high frequencies, in the region of 915 MHz, and the patch antenna is sized accordingly. A typical antenna is about 50 mm by 25 mm in size. The exact shape, size and type of the antenna will depend in practice on the required radiation pattern and the operating frequency.

The substrate (not shown in FIG. 1) is typically the surface of a package or container which is required to be identified by the transponder. Thus, the transponder is programmed with an identification code, which can identify the article to which it is attached, either uniquely or as one of a number of identical articles. Particularly in the latter case, where relatively low-cost articles such as packages of foodstuffs are required to be identified in a supermarket or other retail outlet, the cost of providing the coded transponder and securing it to the package becomes critical.

Referring now to FIGS. 2 to 6, the transponder 10 is illustrated schematically on a conveyor belt 22. A programming unit 24 stores the identification code which is to be loaded into the transponder, and is connected to the terminals 12, 14 and 16 of the transponder as it passes the programming unit by means of spring loaded contact pins 26. The transponder 10 contains an EPROM, and the desired identification code (typically a 38 to 64 bit code) is burnt into the EPROM. The transponder 10 then moves on, and a following transponder is programmed.

Figure 3:
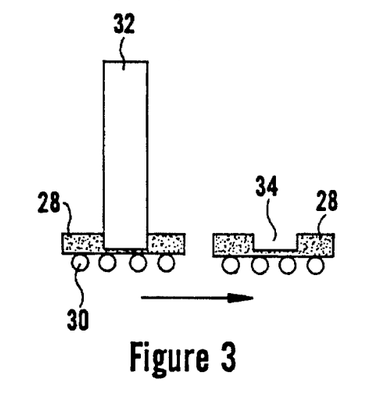

In FIG. 3, sections of cardboard sheet 28 are shown being moved on rollers 30. The cardboard sheets are blanks which will be folded into boxes, for example, for containing foodstuffs. A punch 32 is operated as each cardboard blank passes underneath it, creating a cavity or indentation 34 at a desired location in each blank.

Figure 4:
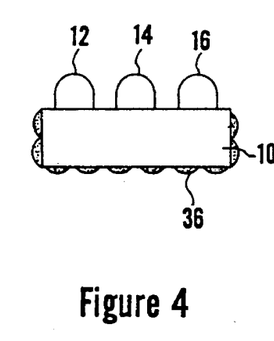

As shown in FIG. 4, a layer of adhesive 36 is now applied to the underside and the sides of the transponder 10. Using a pick and place machine 38 (see FIG. 5) the transponder 10 is located in the indentation or cavity 34 in the blank 28 as it passes the pick and place machine, so that the transponder is secured to the cardboard blank with its upper surface flush with the upper surface of the blank.

Figure 5:
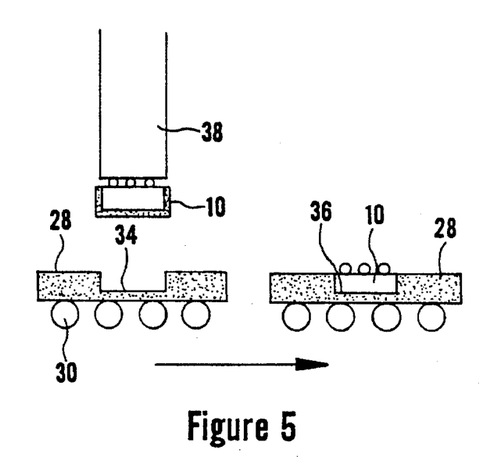

Apart from securing the transponder 10 to the cardboard substrate 28, the adhesive 36 provides environmental protection for the integrated circuit, for example, against moisture. In addition, the adhesive serves to insulate the substrate of the circuit, that is, the sides and the bottom of the circuit, which are normally either at the ground or supply potential of the integrated circuit. This is important to prevent the integrated circuit substrate being shorted to any portion of the antenna which is applied to the substrate in the next step.

Figure 6:
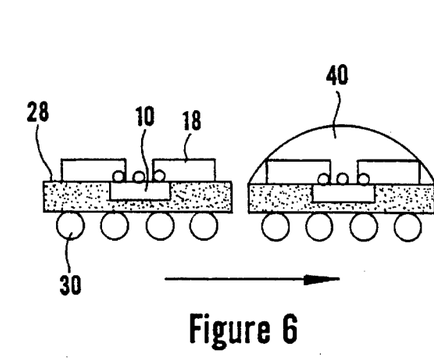

In the next step, the antenna 18 is applied to the surface of the substrate 28, by printing a conducting ink on the substrate in the required shape. The ink can be metallic or carbon based, for example, such as "Colag" ink or graphite paste. Finally, a protective coating 40 is applied to the substrate over the transponder 10 and the antenna 18, to protect it from moisture and mechanical damage. The protective coating can be another layer of ink, which is preferably non-conducting, or else may comprise a plastic sealant. As a further alternative, the protective layer may comprise a label, such as a self-adhesive label, upon which is printed a conventional bar code with a number corresponding to the identification code programmed into the transponder 10. This allows the final package to be identified both by means of the transponder 10 and the bar code.

Figure 7:
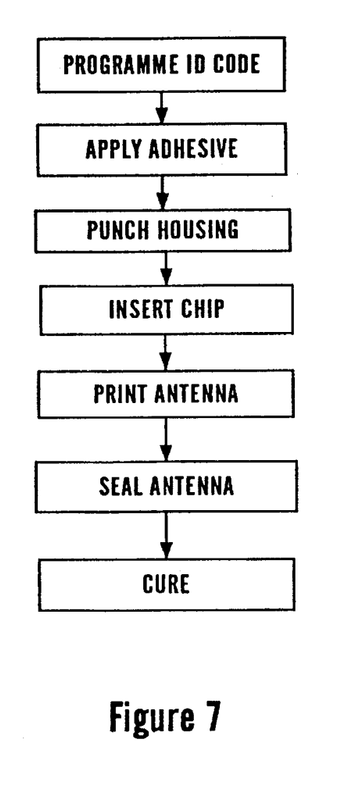
FIG. 7 is a flow chart summarising in the steps illustrated in FIGS. 2 to 6.

The above described steps are set out in the simplified flow chart of FIG. 7.

The cardboard blank 28 is now fed through the remaining stages of production, including a printing stage, and a cutting and folding stage in which the blank is formed into a cardboard box which can be filled as usual. The completed and filled box can be delivered to a retailer in the usual way, where it can be identified in a conventional manner, or by using the identification system described in South African patent application No. 92/0039, the contents of which are incorporated herein by reference.

Figure 8:
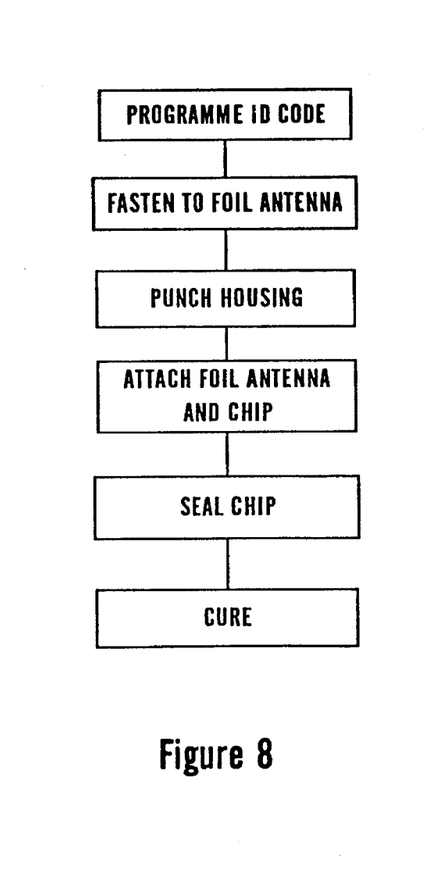
FIG. 8 is a second flow chart, relating to a second method according to the invention.
Figure 9:
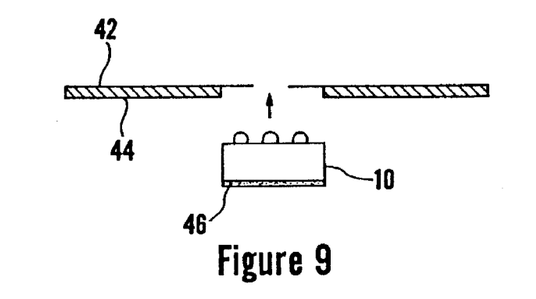
FIGS. 9 to 11 illustrate schematically the second method of attaching the transponder to the substrate.
Figure 10:
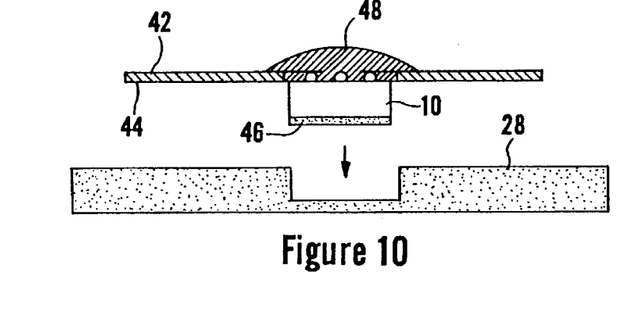
Figure 11:
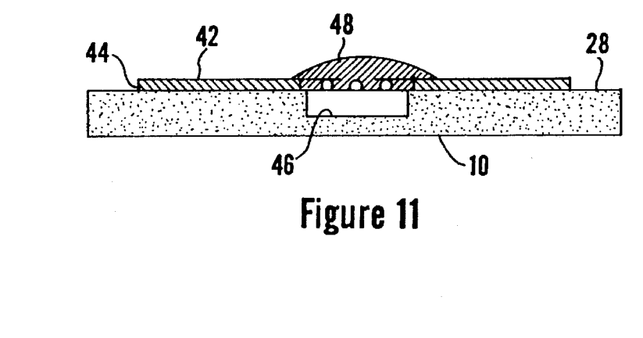

In an alternative version of the invention, the antenna 18 is not printed on the substrate using conductive ink, but comprises a conductive foil layer which is applied to the surface of the substrate. This version of the method is set out in the simplified flow chart of FIG. 8, and is illustrated in FIGS. 9 to 11. The antenna 18 comprises a sheet of self-adhesive metallic foil 42, which is stamped or pre-cut from a strip of the foil. As shown in FIG. 9, the integrated circuit transponder 10 is connected to the underside of the foil strip 42, in an area where the conventional adhesive layer 44 on the foil strip has been removed, using a conductive adhesive compound.

One example of such a conductive/adhesive material is an electrically conductive silver filled epoxy, known commercially as EPO-TEK H20E-PFC. This is a two part epoxy, which can be cured in 15 minutes at 120° C., and which has a sheet resistance of 0.0001 to 0.0004 ohm-cm.

Ideally, a number of transponders 10 are attached to respective foil antennas and are provided on a continuous roll for application to cardboard blanks in a printing process. A layer of adhesive 46 is optionally applied to the underside of the transponder 10. A protective coating 48 of a suitable sealant is applied to the upper surface of the antenna, sealing the area where the antenna and the transponder are connected.

As shown in FIG. 10, the transponder/antenna sub-assembly is placed in abutment with the cardboard substrate 28, so that the transponder 10 is located in the punched cavity or indentation 34. A roller is passed over the transponder/ antenna sub-assembly to secure it to the cardboard blank, by means of the adhesive 44 on the foil 42 of the antenna, and preferably also by means of the layer of adhesive 46 applied to the underside of the transponder 10, with the completed assembly shown in FIG. 11.

In a hybrid version of the above two methods, a self-adhesive foil antenna patch can be applied to the substrate 28 after the transponder 10 has been secured thereto, instead of printing the antenna over the transponder.

Figure 12:
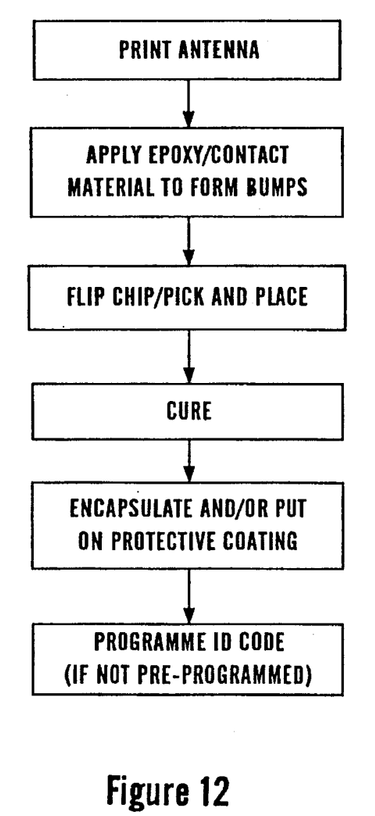
FIG. 12 is a third flow chart, relating to a third version of the method of the invention.
Figure 13:
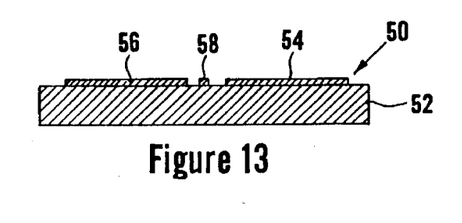
FIGS. 13 to 16, 16a and 17 illustrate schematically the third method of attaching the transponder to the substrate.

A third method according to the invention is illustrated in FIGS. 12 to 17. In this version of the invention, the transponder 10 is not programmed prior to being secured to a substrate, as in the above described two methods. FIG. 12 indicates the steps of this method in flow chart form. As shown in FIG. 13, in the first step, a conductive antenna 50 is printed onto or otherwise secured to a substrate 52. The antenna 50 comprises first and second halves 54 and 56. In addition, a central contact strip 58 is printed between the two antenna halves. This strip is used in programming the transponder 10 with its identification code.

Figure 14:
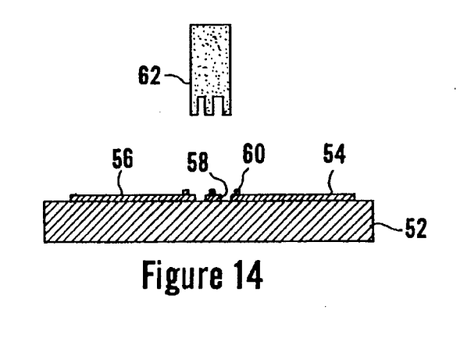

In FIG. 14, conductive bumps 60 comprising a mixture of conductive and adhesive material are applied to contact areas on the antenna halves 54 and 56 and on the contact strip 58 by an applicator 62, for connection to contact points on the transponder itself.

Figure 15:
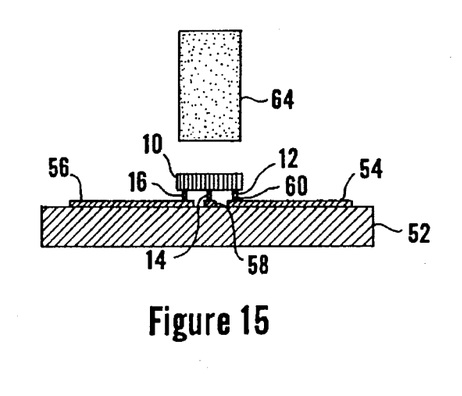
Figure 16:
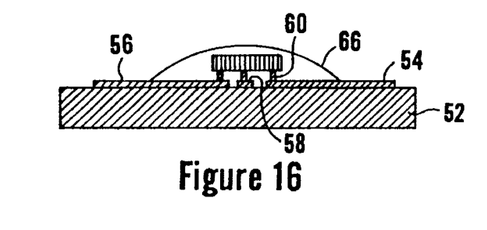
Figure 16A:
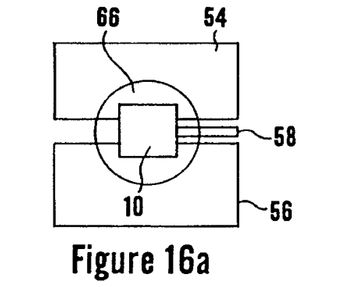

Next, as indicated in FIG. 15, a pick and place machine 64 is used to place the transponder chip 10 in a "flipped" or face down orientation on the antenna 50, with respective contact points 12, 14 and 16 in contact with the respective contact bumps 60 on the antenna half 54, the contact strip 58 and the antenna half 56. A curing step follows, when the adhesive/conductive material connecting the transponder 10 to the antenna and the contact strip is cured and hardened. As shown in FIG. 16, a protective coating 66 of a suitable sealant is then applied over the transponder and the antenna, in the area where the two make contact. However, a substantial portion of the entire antenna and at least a portion of the contact strip 58 remain uncovered (see the schematic plan view of FIG. 16a) as they are still required for programming of the transponder.

Figure 17:
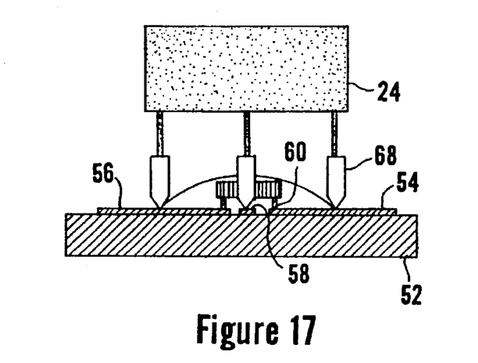

Finally, as shown in FIG. 17, a programming unit 24 having spring loaded contact pins 68 is positioned over the transponder 10 with its respective pins 68 in contact with the contact strip 58 and the antenna halves 54 and 56, and the transponder is then programmed with its identification code. If required, a further thin protective coating can be applied to cover the exposed portions of the antenna and the contact strip.

Of course, instead of a single contact strip, two or more such strips can be provided for purposes of programming the transponder.

Figure 18:
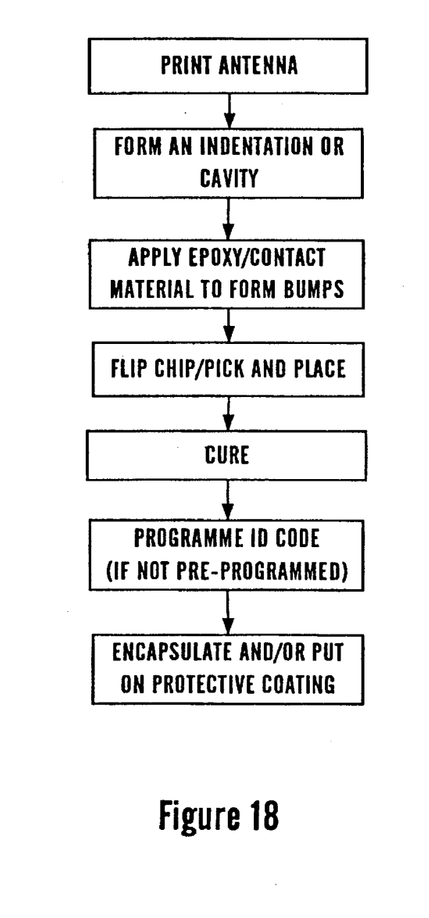
FIG. 18 is a fourth flow chart, relating to a fourth version of the method according to the invention.
Figure 19:
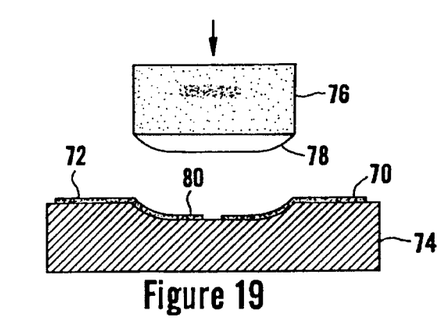
FIGS. 19 to 23 illustrate schematically the fourth method of attaching the transponder to the substrate.

A further embodiment of the invention is illustrated in FIGS. 18 to 23. FIG. 18 summarises this version of the method in flow chart form. In this version of the method, an antenna comprising a first half 70 and a second half 72 is printed or applied to the surface of a substrate 74 as described above. A punch 76 with a curved end surface 78 is used to form an indentation 80 in the surface of the substrate in the central portion of the antenna. The central portion of the indentation 80, where a transponder 10 is to be attached, is flat. The curved face of the punch and the depth of the indentation 80 are chosen so that the antenna is not damaged during this step.

Figure 20:
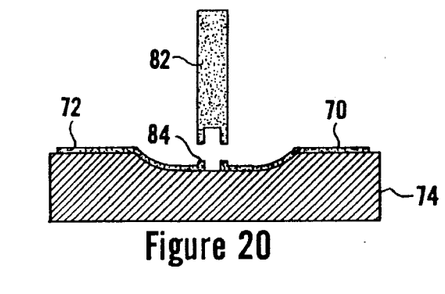
Figure 21:
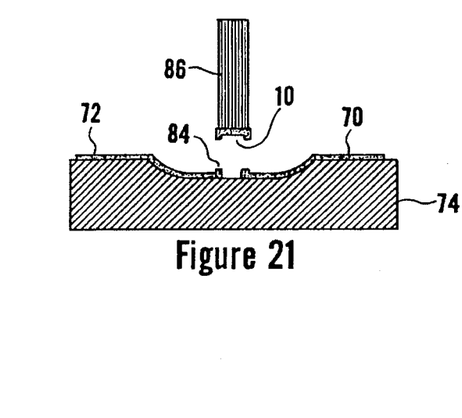
Figure 22:
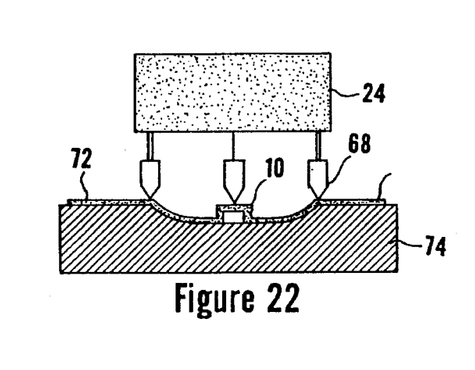

As shown in FIG. 20, an applicator device 82 is used to form adhesive contact bumps 84 at the inner edges of the antenna halves 70 and 72, which correspond to contact points on the transponder chip. As shown in FIG. 21, a pick and place machine 86 is then used to locate the transponder 10 on the antenna with its contact points in contact with the respective conductive bumps 84, similarly to the procedure described with reference to FIG. 15. The adhesive/conductive material of the contact bumps 84 is then heat cured. As shown in FIG. 22, the transponder 10 can now be programmed with its identification code by means of the above described programming unit 24 with its spring-loaded contact pins 68, which make contact with the antenna halves 70 and 72, and with the conductive substrate of the transponder chip 10.

Figure 23:
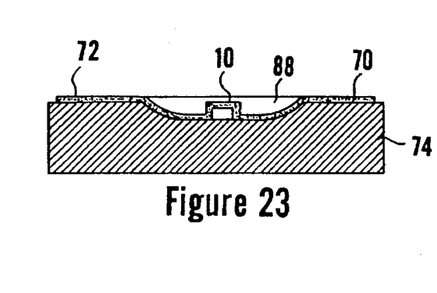

Finally, a protective layer 88 of a suitable sealant is applied over the indentation in the centre of the antenna, over the transponder 10, leaving the substrate 74 with a substantially flat upper surface.

Figure 24:
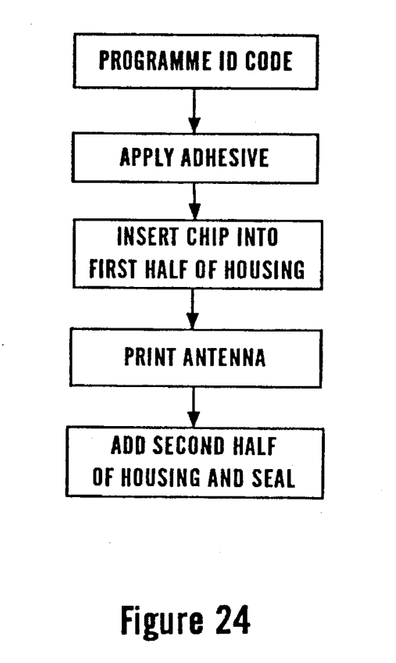
FIG. 24 is a fifth flow chart, relating to a fifth version of the method of the invention.

Still another version or the invention is illustrated in FIGS. 24 to 28. FIG. 24 summarises this version of the method in flow chart form. In this embodiment, the substrate to which the transponder is attached is a housing having at least two components between which the transponder chip is held. The completed housing may be, for example, an identification or price tag which is applied to an article of merchandise, or an identification card.

Figures 25, 26:
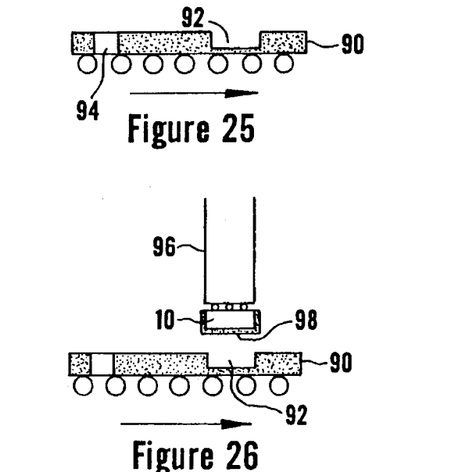
FIGS. 25 to 28 illustrate schematically the fifth method of attaching the transponder to the substrate.

As shown in FIG. 25, a first half 90 of the housing is formed with an indentation or cavity 92 sized to receive a transponder chip. The housing half 90 also has a hole or other attachment means 94 formed in it, for later attachment of the housing to another article.

As shown in FIG. 26, a pick and place machine 96 is used to place a transponder chip 10, the sides and bottom of which have been coated with an adhesive layer 98, into the cavity 92.

Figure 27:
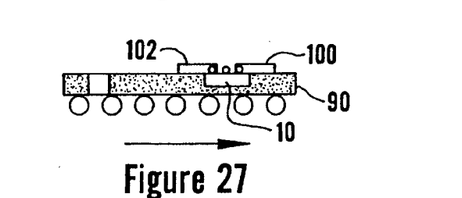
Figure 28:
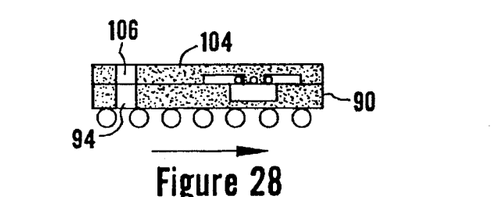

As shown in FIG. 27, an antenna comprising first and second halves 100 and 102 is then printed or otherwise located over the transponder chip 10, in much the same manner as the first two embodiments of the invention described above. The second housing half 104 is then placed against the first housing half 90 and fixed to it, for example, by means of adhesive, a heat welding step, or another method. The second housing half 104 has an aperture 106 in it which is aligned with the aperture 94 in the first housing half, so that the resulting composite device has an aperture in it, allowing the device to be attached to another article as required.

The above described methods can be applied to a number of different substrates. Where an indentation must be made in the substrate, substrates of softer material such as cardboard and certain plastics materials are preferred. In some cases, suitable indentations or cavities can be moulded into plastics or other substrates, and it is also possible to punch or cut cavities or indentations in harder materials such as a metals or glass, depending on requirements. Obviously, the type of operation which is required to create a cavity, where required, will affect the cost of the method.

In the case of a cardboard substrate, the transponder and its antenna can be attached prior to the folding of the cardboard into a box or other package. The cavity or indentation for receiving the transponder can easily be pushed into the cardboard prior to attachment of the transponder and subsequent folding of the cardboard, while the antenna can be printed or applied to the cardboard either before or after folding thereof.

In the case of a container such as a bottle, access to the interior of the container is restricted after manufacture thereof, making it difficult to apply a transponder and an antenna to an inner surface of the container. Various solutions are possible. A plastics container will commonly be manufactured in a mould. During the moulding process, an indentation or cavity in the surface of the container can be included, into which the transponder chip can subsequently be placed and adhered. An antenna can then be printed or placed over the transponder chip, and a label placed over both the antenna and the transponder, concealing them. As an alternative, an indentation can be made in the plastics substrate using a heated tool.

As a further alternative, the transponder chip itself can be heated and pressed into the plastics substrate, so that it melts the adjacent plastic and adheres to it once it cools. The antenna can then be attached as described above.

In the case of a glass substrate, such as a bottle or other container, the transponder and its antenna will normally have to be attached after the manufacture of the container. This can be done in the same way as with a plastics substrate, by pre-indenting the glass during manufacture of the container, and by then hiding the transponder and its antenna under a label or a suitable tough protective coating. As an alternative, the transponder and its antenna can be incorporated in the lid of the container, as shown in FIG. 29.

Figure 29:
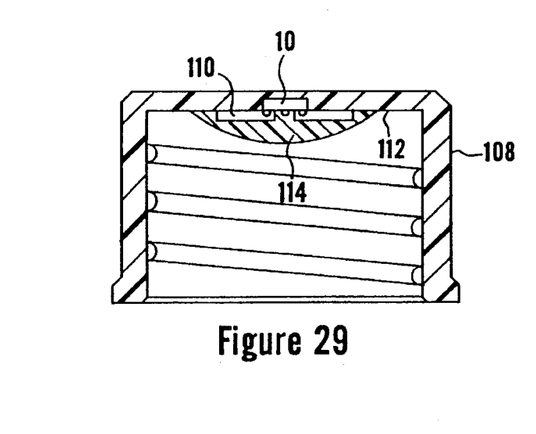
FIG. 29 is a partial sectional side view of a cap for a container to which a transponder has been attached by the method of the invention.

In FIG. 29, a plastics screw cap 108 is shown, with the transponder chip 10 and its associated antenna 110 located on the inner end surface 112 of the cap, with a protective coating 114 of a suitable sealant. This is particularly convenient in the case of moulded plastics caps or lids. In such a case, at least a portion of the cap or lid, in the region where the transponder and its antenna are applied, must be non-metallic.

In the case of a metal substrate, it is not possible to print a conductive antenna directly onto the metal, as this would short out the antenna. Thus, it is necessary first to provide an insulating layer on the metal substrate before such a printing step. Alternatively, of course, a conductive foil antenna can be used with a suitable insulating layer between the antenna and the metal substrate.

The transponder 10 can be programmed with its identification code at the time of manufacturing. However, users of the transponders are afforded maximum flexibility if the identification code is programmed in at the time of attaching the transponder to its substrate. A number of possibilities arise. Firstly, the transponder can be programmed prior to being attached to the substrate or the antenna itself, for example by means of direct contact onto the contact points on the transponder chip. Secondly, the transponder can be programmed after attachment to the substrate but prior to the printing or application of the antenna onto the substrate. Thirdly, programming can be carried out after the attachment of both the transponder and printing or attachment of the antenna, but prior to the application of the protective coating. In this case, three contact points are normally required, one each to the two halves of the antenna and a third to a contact strip applied to the transponder, or directly onto a third contact on the transponder, or even directly to the substrate of the transponder. Fourthly, programming can even be carried out after the transponder and the adjacent portion of the antenna have been covered with a protective coating, by using the method described with reference to FIGS. 12 to 17.

In some applications it will be advantageous to program the transponder as late as possible in the process, after attachment of the antenna, and possibly also the protective coating. For example, where the substrate is an identification label to be applied to an article, with the transponder and its antenna attached thereto, the labels can be programmed shortly before they are issued for attachment to the relevant packaging.

In the process of attaching the transponder chip and the antenna to the substrate, a number of different adhesives and sealants may be required. As mentioned above, curing may be required in some of the steps. In order to increase manufacturing volumes, the various adhesives and sealants need to be rapid-curing types. Various different curing methods can be used, according to the type of substrate and the type of adhesive/sealant in use. For example, conventional heat sources such as ovens can be used for curing, or hot air blowers can be used. Infra-red, ultra-violet or radio-frequency radiation can also be used, depending on the type of sealant. In some cases, cooling of the substrate may be appropriate for curing purposes.

Figure 30:
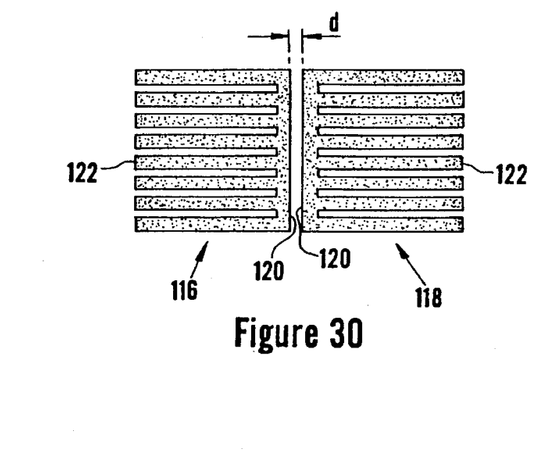
FIG. 30 is a plan view of a typical patch antenna employed in the method of the invention.

In order to minimise the cost of the antenna, it is preferred to print it on the substrate using a conductive ink. In this context, the word "ink" is intended to mean a liquid or paste, for example, which can be applied in a desired shape or pattern to a substrate, and not necessarily a coloured or visible liquid. The ink contains a conductive component, such as particles of metal or carbon. A number of different printing methods can be used, such as silk screen methods, stencilling, spraying or conventional lithography. As mentioned above, the exact shape and size of the antenna depends on the frequency used and the radiation pattern required, which in turn depends on the specific application. A typical antenna design is illustrated in FIG. 30, and is seen to comprise two halves 116 and 118, each of which has a base region 120 from which extend a plurality of parallel fingers 122. The spacing d between the halves 116 and 118 is determined by the spacing of the relevant contacts or terminals on the integrated circuit.

The materials used for the conductive ink must have a sufficiently low resistance to allow sufficient current flow in the antenna to allow the transponder to be powered up at the required operating range. In some cases, the printed ink may need to be flexible, to allow bending or twisting of the antenna. Table 1 shows the results obtained with silver epoxy and silver ink, which were found to be suitable in prototype applications of the invention. Another possibility is ink containing carbon particles.

TABLE 1

| | TYPE OF INK TESTED | |
|---|---|---|
| TEST PERFORMED | SILVER EPOXY | SILVER INK |
| Sheet Resistance (mOhm/Square) | 35.5 | 30.5 |
| Contact Resistance — Silver Epoxy contact (mOhm) | 10 | 1000 |
| Bending and Torsion | Passed | Passed |
| Antenna Gain (dB) | 0.5 | −2 |

The contacts between the transponder chip and the antenna are important and a number of alternative methods of creating acceptable contacts are possible. As described above, the use of an adhesive material such as an epoxy resin with a conductive filler can be used to obtain an electrically adequate and physically strong join between the transponder and the antenna. An alternative is to provide solder bumps on the contact points of the transponder chip, which can be created by passing the wafer containing the chips through a wave soldering machine, or by screen printing solder paste onto the contact points, for example. Once the antenna is printed or applied to these solder bumps, the solder can be reflowed by heating, effectively providing soldered joints between the transponder and the antenna.

Although the above described methods have been described with reference to the printing or attachment of a patch antenna to the substrate and the integrated circuit transponder, this is merely exemplary, and is appropriate for the frequency range employed in the prototype system. Obviously, depending on the application of the end product and the specifications of the system in which it is to be used, different types of antenna may be employed. For example, a loop or coil of fine wire could be attached to each antenna terminal of the integrated circuit. Alternatively, elongate antenna elements of wire or foil could be connected to each antenna terminal. Of course, such loops, coils or elongate antenna elements could be printed in much the same way as described above. Which method of forming and applying the antenna is chosen will depend on the volumes required. In high volume applications, the printing of the antenna using a conductive ink or the like is advantageous.

The above described methods make it possible to attach integrated circuit transponders (or other electronic circuits) to suitable substrates in large volumes, allowing the implementation of an automatic identification system which can be applied to large numbers of articles of a relatively low cost.

Although different aspects of the method of the present invention have been described with reference to the attachment of integrated circuit transponders to various substrates, it will be appreciated that the invention is not limited to use with transponders, but that other electronic circuits (not necessarily integrated circuits) can be attached to substrates in the same way.

We claim:

1. A method of attaching an electronic circuit to a substrate, comprising:

providing an electronic circuit having at least two electrical terminals;

securing the electronic circuit to the substrate;

applying a metallic foil to the substrate and the electronic circuit to define an antenna, so that the metallic foil makes electrical contact with the at least two electrical terminals, wherein:

the metallic foil has an adhesive layer thereon for securing the metallic foil to the substrate, and the adhesive layer is removed from the metallic foil in areas corresponding to positions of the electrical terminals of the electronic circuit prior to application of the metallic foil to the electronic circuit or the substrate.

2. A method of attaching an electronic circuit to a substrate, comprising:

providing an electronic circuit having at least two electrical terminals;

securing the electronic circuit to the substrate;

applying a conductive element to the substrate and the electronic circuit to define an antenna, so that the conductive element makes electrical contact with the at least two electrical terminals; and applying a protective coating over the electronic circuit and at least a portion of the antenna, wherein the protective coating comprises a layer of settable sealant.

3. A method of attaching an integrated circuit to a substrate, comprising:

providing an integrated circuit having at least two electrical terminals, wherein the electronic circuit comprises a transponder which is programmable with an identity code;

securing the integrated circuit to the substrate;

applying a conductive element to the substrate and the integrated circuit to define an antenna, so that the conductive element makes electrical contact with the at least two electrical terminals;

applying at least one contact element to the substrate which is in contact with a terminal of the transponder;

applying contacts of a programming device to the antenna and the at least one contact element after securing the integrated circuit and the antenna to the substrate to program the identity code into the transponder; and applying a protective coating to the transponder, a portion of the antenna and a portion of the contact element prior to programming of the transponder, wherein the contacts of the programming device are applied to uncoated portions of the antenna and the contact element.

4. A method of attaching an electronic circuit to a substrate comprising:

providing an electronic circuit having at least two electrical terminals;

securing the electronic circuit to the substrate; and applying a metallic foil layer to the substrate and the electronic circuit to define an antenna, so that the metallic foil layer makes contact with the at least two electrical terminals.

5. A method according to claim 4, wherein the metallic foil layer is applied to the electronic circuit prior to securing the electronic circuit to the substrate, with the metallic foil layer and the circuit being applied together to the substrate.

6. A method according to claim 4, wherein the metallic foil layer is applied to the substrate after the electronic circuit has been secured to the substrate.

7. A method according to claim 4, wherein the metallic foil layer has an adhesive layer thereon for securing the foil to the substrate.

8. A method according to claim 4, wherein the metallic foil layer is applied to the substrate prior to securing the electronic circuit to the substrate, and the electronic circuit is subsequently attached to predetermined areas of the metallic foil layer, thereby to secure the electronic circuit to the substrate.

9. A method according to claim 4, further comprising attaching the electrical contacts of the electronic circuit to predetermined areas of the metallic foil layer using contact adhesive.

10. A method according to claim 4, further comprising forming an indentation in the substrate to receive the electronic circuit.

11. A method according to claim 10, wherein the indentation is formed by punching or stamping the substrate.

12. A method according to claim 10, wherein the indentation is formed by molding.

13. A method according to claim 10, wherein the indentation is formed in a plastic substrate by the application of a heated tool.

14. A method according to claim 10, wherein the indentation is formed in a plastic substrate by heating the electronic circuit and pressing it into the substrate.

15. A method according to claim 10, wherein an upper face of the electronic circuit bearing the electrical terminals is substantially flush with the surface of the substrate being secured thereto.

16. A method according to claim 4, further comprising applying solder to the at least two electrical terminals, applying the metallic foil layer to the substrate so that it makes contact with the terminals, and reflowing the solder to join the metallic foil layer to the terminals.

17. A method according to claim 4, further comprising applying a protective coating over the electronic circuit and at least a portion of the antenna.

18. A method according to claim 17, wherein the protective coating comprises a layer of settable sealant.

19. A method according to claim 17, wherein the protective coating comprises a label.

20. A method according to claim 4, wherein the electronic circuit is an integrated circuit.

21. A method according to claim 20, wherein the integrated circuit is programmable with an identity code.

22. A method according to claim 21, further comprising programming the identity code before the integrated circuit is applied to the substrate.

23. A method according to claim 21, further comprising programming the identity code after the integrated circuit is applied to the substrate by applying contacts of a programming device to both the integrated circuit and the antenna.

24. A method according to claim 23, further comprising providing a contact element of the substrate which is in contact with a respective terminal of the integrated circuit, applying at least one contact of the programming device to the contact element, and applying another contact of the programming device to the antenna.

25. A method according to claim 24, further comprising applying a protective coating over the integrated circuit, a portion of the antenna and a portion of the contact element prior to programming, the contacts of the programming device being applied to uncoated portions of the antenna and the contact element.

26. A method according to claim 4, wherein the substrate comprises at least first and second components, the second component being secured to the first component after attachment of the electronic circuit and the antenna thereto, so that the electronic circuit and antenna are substantially enclosed.

27. A method of attaching an electronic circuit to a substrate comprising:

providing an electronic circuit having at least two electric terminals;

providing an indentation in the substrate;

inserting the electronic circuit into the indentation;

securing the electronic circuit to the substrate; and applying a conductive element to the substrate and the electronic circuit to define an antenna, so that the conductive element makes electrical contact with the at least two electrical terminals.

28. A method according to claim 27, wherein the indentation is formed by punching or stamping the substrate.

29. A method according to claim 27, wherein the indentation is formed by molding.

30. A method according to claim 27, wherein the indentation is formed in a plastic substrate by the application of a heated tool.

31. A method according to claim 27, wherein the indentation is formed in a plastic substrate by heating the electronic circuit and pressing it into the substrate.

32. A method according to claim 27, wherein an upper face of the electronic circuit bearing the electrical terminals is substantially flush with the surface of the substrate being secured thereto.

33. A method according to claim 27, wherein the step of applying a conductive element comprises printing, in the shape of the antenna, a layer of conductive ink over the substrate and the electronic circuit, so that the conductive ink makes contact with the at least two electrical terminals.

34. A method according to claim 33, further comprising applying solder to the at least two electrical terminals, printing the conductive ink over the at least two electrical terminals and the substrate, and reflowing the solder to join the conductive ink to the terminals.

35. A method according to claim 27, further comprising applying a protective coating over the electronic circuit and at least a portion of the antenna.

36. A method according to claim 35, wherein the protective coating comprises a layer of settable sealant.

37. A method according to claim 35, wherein the protective coating comprises a label.

38. A method according to claim 35, wherein the electronic circuit is an integrated circuit.

39. A method according to claim 38, wherein the integrated circuit is programmable with an identity code.

40. A method according to claim 39, further comprising programming the identity code before the integrated circuit is applied to the substrate.

41. A method according to claim 39, further comprising programming the identity code after the integrated circuit is applied to the substrate by applying contacts of a programming device to both the integrated circuit and the antenna.

42. A method according to claim 41, further comprising providing a contact element of the substrate which is in contact with a respective terminal of the integrated circuit, applying at least one contact of the programming device to the contact element, and applying the other contact of the programming device to the antenna.

43. A method according to claim 42, further comprising applying a protective coating over the integrated circuit, a portion of the antenna and a portion of the contact element prior to programming, the contacts of the programming device being applied to the uncoated portions of the antenna and the contact element.

44. A method according to claim 27, wherein the substrate comprises at least a first and second component, the second component being secured to the first component after attachment of the electronic circuit and the antenna thereto, so that the electronic circuit and antenna are substantially enclosed.

* * * * *